(12) United States Patent
Park et al.

(10) Patent No.: US 9,966,948 B2
(45) Date of Patent: May 8, 2018

(54) INDUCTOR TYPE TOUCH INPUT IN EXPLOSION-PROOF ELECTRONIC ENCLOSURE

(71) Applicant: Honeywell International Inc., Morris Plains, NJ (US)

(72) Inventors: JunSeong Park, Seoul (KR); Jeffrey Lee, Seoul (KR); Dongil Ko, Seoul (KR); JePhil Ahn, Mapo-Gu (KR)

(73) Assignee: Honeywell International Inc., Morris Plains, NJ (US)

( * ) Notice: Subject to any disclaimer, the term of this patent is extended or adjusted under 35 U.S.C. 154(b) by 23 days.

(21) Appl. No.: 15/045,770

(22) Filed: Feb. 17, 2016

(65) Prior Publication Data

US 2017/0235385 A1    Aug. 17, 2017

(51) Int. Cl.
*G06F 3/041* (2006.01)
*H03K 17/95* (2006.01)
*G06F 3/046* (2006.01)

(52) U.S. Cl.
CPC ......... *H03K 17/9525* (2013.01); *G06F 3/046* (2013.01)

(58) Field of Classification Search
None
See application file for complete search history.

(56) References Cited

U.S. PATENT DOCUMENTS

| | | | |
|---|---|---|---|
| 5,264,733 A | 11/1993 | Tigges | |
| 2008/0163094 A1* | 7/2008 | Pannese | G03F 7/70525 715/772 |
| 2016/0077650 A1* | 3/2016 | Durojaiye | G06F 3/041 345/173 |
| 2016/0189492 A1* | 6/2016 | Hamam | G06F 3/016 340/407.1 |
| 2017/0060291 A1* | 3/2017 | Chevrier | H03K 17/96 |

FOREIGN PATENT DOCUMENTS

CN    104009746 A    8/2014

* cited by examiner

*Primary Examiner* — Joseph Haley
(74) *Attorney, Agent, or Firm* — Wick Phillips Gould & Martin LLP

(57) ABSTRACT

An explosion-proof electronic system. The system comprises a substantially explosion-proof enclosure, a substantially explosion-proof glass window forming a portion of the enclosure, an electrical coil located within the enclosure, an electrical excitation circuit located within the enclosure and connected to the electrical coil, where the excitation circuit is configured to cause the electrical coil to establish a magnetic field that extends through the explosion-proof glass window, and a processor located within the enclosure and coupled to the electrical excitation circuit. The processor is configured to monitor the electrical excitation circuit, determine an electrical inductance of the electrical coil based on monitoring the electrical excitation circuit, identify a fluctuation of the electrical inductance that exceeds a predetermined threshold as a control input, and transmit an output in response to the control input, whereby a human operator can provide the control input by bringing a finger proximate to the explosion-proof glass window.

6 Claims, 1 Drawing Sheet

INDUCTOR TYPE TOUCH INPUT IN EXPLOSION-PROOF ELECTRONIC ENCLOSURE

CROSS-REFERENCE TO RELATED APPLICATIONS

None.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Explosion-proof instruments may be employed in industrial processes or environments where explosions are a hazard, for example in industrial burners or in combustible gas distribution systems. The term "explosion-proof" may mean invulnerable to explosions below a pre-defined intensity level. Said in other words, an explosion-proof device or instrument may fail when subjected to an explosion that exceeds a defined explosion resistance capacity of the device or instrument.

SUMMARY

In an embodiment, an explosion-proof electronic system is disclosed. The explosion-proof electronic system comprises a substantially explosion-proof enclosure, a substantially explosion-proof glass window forming a portion of the enclosure, an electrical coil located within the explosion-proof enclosure, an electrical excitation circuit located within the explosion-proof enclosure and connected to the electrical coil, and a processor located within the explosion-proof enclosure and coupled to the electrical excitation circuit. The excitation circuit is configured to cause the electrical coil to establish a magnetic field that extends through the explosion-proof glass window. The processor is configured to execute instructions that monitor the electrical excitation circuit, determine an electrical inductance of the electrical coil based on monitoring the electrical excitation circuit, identify a fluctuation of the electrical inductance that exceeds a predetermined threshold as a control input, and transmit an output in response to identifying the control input, whereby a human operator can provide the control input by bringing a finger proximate to the explosion-proof glass window.

In another embodiment, an explosion-proof electronic system is disclosed. The explosion-proof electronic system comprises a substantially explosion-proof enclosure, an electrical coil located within the explosion-proof enclosure, an electrical excitation circuit located within the explosion-proof enclosure and connected to the electrical coil, and a processor located within the explosion-proof enclosure and coupled to the electrical excitation circuit. The excitation circuit is configured to cause the electrical coil to establish a magnetic field that extends beyond the explosion-proof enclosure. The processor is configured to monitor the electrical excitation circuit, determine an electrical inductance of the electrical coil based on monitoring the electrical excitation circuit, identify a fluctuation of the electrical inductance that exceeds a predetermined threshold as a control input, and transmit an output in response to identifying the control input, whereby a human operator can provide the control input by bringing a finger proximate to the explosion-proof enclosure.

In yet another embodiment, an explosion-proof electronic system is disclosed. The explosion-proof electronic system comprises a substantially explosion-proof enclosure, an electrical coil located within the explosion-proof enclosure, an electrical excitation circuit located within the explosion-proof enclosure and connected to the electrical coil, and a processor located within the explosion-proof enclosure and coupled to the electrical excitation circuit. The excitation circuit is configured to cause the electrical coil to establish a magnetic field that extends through the explosion-proof enclosure. The processor is configured to monitor a power factor (PF) of the electrical excitation circuit, identify a fluctuation of the PF of the electrical excitation circuit that exceeds a predetermined threshold as a control input, and transmit an output in response to identifying the control input, whereby a human operator can provide the control input by bringing a finger proximate to the explosion-proof enclosure.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

This disclosure teaches an explosion-proof electronic device that is controllable through interaction between a finger brought proximate to the device and an electrical coil inside the device. The electrical coil is excited by an oscillating voltage and establishes a magnetic field. A finger brought into the magnetic field—i.e., close to an explosion-proof glass window retained by an explosion-proof enclosure of the device—interacts with the magnetic field to change the effective inductance of the electrical coil. Said in another way, bringing a human finger into the magnetic field alters a power factor (PF) of an excitation circuit. This altered PF can be detected by a processor monitoring the excitation circuit and identified as an input: for example as a selection input and/or deselection input. The processor can then take some other action based on the input, for example generating and/or outputting a control command or output. It is understood that the finger need not physically touch the explosion-proof electronic device and/or explosion-proof glass window in order to interact with the magnetic field and/or to provide the input. It is further understood that other objects that are susceptible for interacting with a magnetic field may likewise be used to provide the input.

Figure 1:
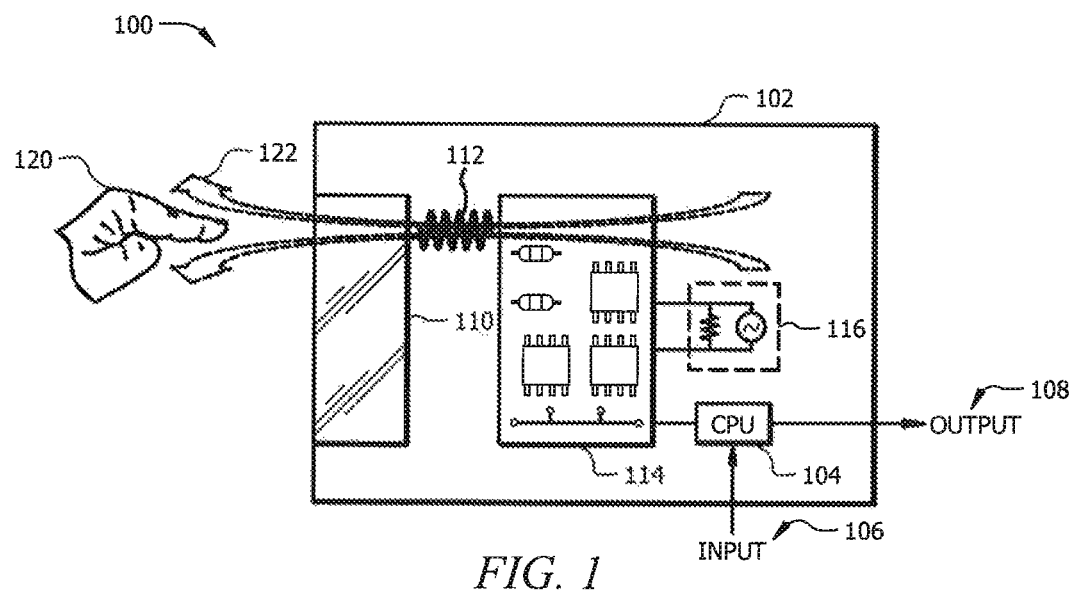
FIG. 1 is an illustration of an explosion-proof gas detector according to an embodiment of the disclosure.

Turning now to FIG. 1, an explosion-proof electronic system 100 is described. In an embodiment, the explosion-proof electronic system 100 comprises an explosion-proof enclosure 102, a processor 104, an input to the processor 106, and an output from the processor 108. The system 100 further comprises an explosion-proof glass window 110, an electrical coil 112, and an excitation circuit 116. In an embodiment, one or more of processor 104, the electrical coil 112, and/or the excitation circuit 116 may be mounted on a printed circuit board 114. The processor 104, the electrical coil 112, and the excitation circuit 116 are located within the explosion-proof enclosure 102 while the explosion-proof glass window 110 may be said to form a portion of the enclosure 102.

In an embodiment, the electrical coil 112 may be positioned within the enclosure 102 such that a longitudinal axis of the electrical coil 112 (the axis roughly perpendicular to a plane of the parallel coil windings) is substantially perpendicular to the explosion-proof glass window 110. In an embodiment, the electrical coil 112 may be positioned within the enclosure 102 such that a plane of the parallel coil windings of the electrical coil 112 are roughly parallel to the plane of the explosion-proof glass window 110. Either of these physical orientations of the electrical coil 112 may promote directing and/or beaming a concentrated portion of a magnetic field established by the electrical coil 112 through and/or beyond the explosion-proof glass window 110.

When the excitation circuit 116 is active (i.e., when powered), the circuit 116 causes the electrical coil 112 to build or establish a magnetic field 122. In an embodiment, the circuit 116 provides an alternating current (AC) input to the electrical coil 112. In an embodiment, the circuit 116 provides an AC voltage input to the electrical coil 112. In an embodiment, the circuit 116 may be an oscillator. The electrical coil 112 may be said to have a natural value of induction, for example an induction value based on a number of windings of wire or coils of wire that compose the electrical coil 112, the diameter of a spool on which the windings may be wound, a spacing between adjacent windings, and other physical and/or geometric properties of the electrical coil 112. The electrical coil 112 may introduce a current-voltage offset or phase shift when stimulated with an alternating current (AC) voltage. This current-voltage phase shift may be quantified and/or observed as a power factor (PF) of the excitation circuit 116. As is known to those of skill in the electrical arts, PF is a dimensionless number that, according to one definition, ranges in value from 1 to 0. PF is the ratio of real power to apparent power in an electrical circuit.

When an object, for example a human finger 120, is brought into the magnetic field 122, it can alter the magnetic field 122 thereby altering the apparent induction of the electrical coil 112. Said in other words, when the human finger 120 is brought into the magnetic field 122 proximate to the window 110, the magnetic field 122 is altered, and the PF in the excitation circuit 116 changes. The processor 104 monitors and analyzes the PF in the excitation circuit 116. When the processor 104 determines that the PF has changed beyond a predefined threshold, the processor 104 imputes that change as a control input selection, for example a selection input or a deselection input (i.e., a toggle selection). As an example, a natural inductance of the electrical coil 112 may be about 400 μH (micro-Henries) without a finger proximate to the glass 110 and may be about 403 μH when a finger is proximate to the glass. This small fluctuation (about 1% variation) in effective inductance of the electrical coil 112 can be detected and can be used to impute a control input. It may be that selecting different electrical coil 112 designs may result in greater fluctuations and more readily detected inputs.

The processor 104 can take action based on the input selection, for example setting an alarm threshold, turning on a function of the explosion-proof electronic system 100, or turning off a function of the system 100. The processor 104 may change an output 108 that it produces based on the input selection or deselection. While the human finger 120 may provide the selection interaction, it is contemplated that other objects may also be able to alter the magnetic field 122 when brought into the magnetic field and thereby provide a selection input.

It is understood that the use of the term "explosion-proof" herein does not mean that the system 100, enclosure 102, and/or glass window 110 cannot be damaged or destroyed by an explosion, for example an explosion in which the intensity is very great. The term "explosion-proof" means substantially invulnerable to an explosion of an intensity below a pre-defined limit of intensity or below an explosion rating. This caveat may be indicated herein by the expression "substantially explosion-proof." In an embodiment, the explosion-proof glass window 110 is tempered glass about ¾ inch thick (about 20 mm thick).

The processor 104 is an electronic and/or semiconductor device that is able to perform logical instructions or programs to control the system 100. As part of its function, the processor 104 may produce an output 108 that is transmitted out of the system 100, for example communicated via a communication channel to an external system and/or transmitted to a presentation device outside of the explosion-proof enclosure 102 such as to an aural alarm and/or visual alarm. As an example, the processor 104 may analyze an input 106 from a gas sensor to determine a concentration of one or more kinds of gases in an environment proximate to the system 100. If the processor 104 determines that the concentration of a gas exceeds a predefined threshold concentration, it may output an alarm on output 108. In this example, the electronic system 100 may be said to comprise a gas detector or to be a gas detector.

The processor 104 may be any of a microcontroller (MCU), a microprocessor (MPU), a central processing unit (CPU), a digital signal processor (DSP), a complex programmable logic device (CPLD), a field-programmable gate array (FPGA), or an application-specific integrated circuit (ASIC). In an embodiment, the processor 104 may comprise two or more separate processors, for example two of the same type of processors listed above or for example processors from different processor categories or types.

In an embodiment, the system 100 may receive electrical power from a source external to the explosion-proof enclosure 102. Alternatively, the system 100 may receive electrical power from a battery located within the explosion-proof enclosure 102.

The magnetic field interaction input mode of the system 100 may provide benefits relative to known systems that may be slow to transition and respond to control inputs. It is understood that the system 100 may be advantageously applied in a variety of other systems.

Figure 2:
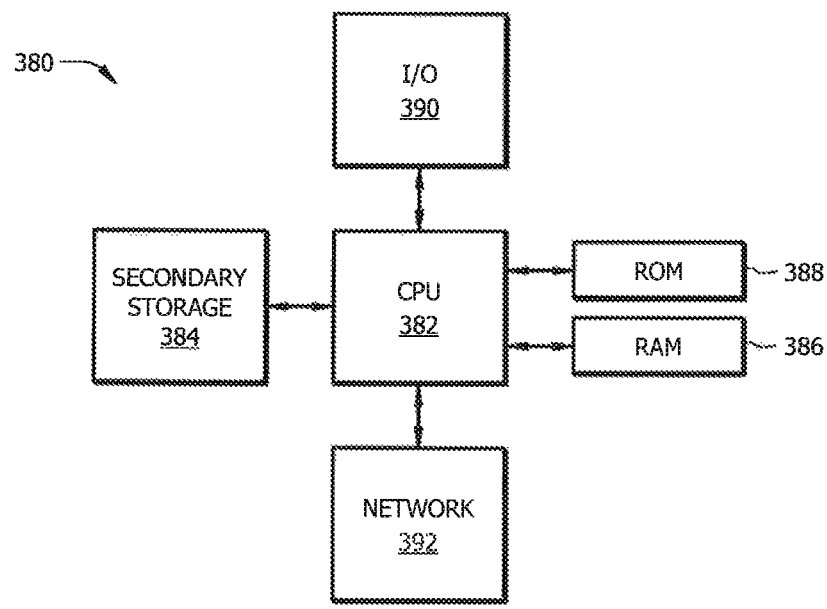
FIG. 2 is an illustration of a computer system according to an embodiment of the disclosure.

FIG. 2 illustrates a computer system 380 suitable for implementing one or more aspects of embodiments of explosion-proof electronic devices or instruments disclosed herein. It is understood that some elements of the computer system 380 illustrated in FIG. 2 and described below may not be present in some of the explosion-proof electronic systems 100, for example, in an embodiment, the explosion-proof electronic system 100 may not comprise secondary storage or network connectivity. Notwithstanding, these features are illustrated and described at least for the sake of completeness.

The computer system 380 includes a processor 382 (which may be referred to as a central processor unit or CPU) that is in communication with memory devices including secondary storage 384, read only memory (ROM) 388, random access memory (RAM) 386, input/output (I/O) devices 390, and network connectivity devices 392. The processor 382 may be implemented as one or more CPU chips.

It is understood that by programming and/or loading executable instructions onto the computer system 380, at least one of the CPU 382, the RAM 386, and the ROM 388 are changed, transforming the computer system 380 in part into a particular machine or apparatus having the novel functionality taught by the present disclosure. It is fundamental to the electrical engineering and software engineering arts that functionality that can be implemented by loading executable software into a computer can be converted to a hardware implementation by well-known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an application-specific integrated circuit (ASIC), because for large production runs the hardware implementation may be less expensive than the software implementation. Often a design may be developed and tested in a software form and later transformed, by well-known design rules, to an equivalent hardware implementation in an application-specific integrated circuit that hardwires the instructions of the software. In the same manner as a machine controlled by a new ASIC is a particular machine or apparatus, likewise a computer that has been programmed and/or loaded with executable instructions may be viewed as a particular machine or apparatus.

Additionally, after the system 380 is turned on or booted, the CPU 382 may execute a computer program or application. For example, the CPU 382 may execute software or firmware stored in the ROM 388 or stored in the RAM 386. In some cases, on boot and/or when the application is initiated, the CPU 382 may copy the application or portions of the application from the secondary storage 384 to the RAM 386 or to memory space within the CPU 382 itself, and the CPU 382 may then execute instructions that the application is comprised of. In some cases, the CPU 382 may copy the application or portions of the application from memory accessed via the network connectivity devices 392 or via the I/O devices 390 to the RAM 386 or to memory space within the CPU 382, and the CPU 382 may then execute instructions that the application is comprised of. During execution, an application may load instructions into the CPU 382, for example load some of the instructions of the application into a cache of the CPU 382. In some contexts, an application that is executed may be said to configure the CPU 382 to do something, e.g., to configure the CPU 382 to perform the function or functions promoted by the subject application. When the CPU 382 is configured in this way by the application, the CPU 382 becomes a specific purpose computer or a specific purpose machine.

The secondary storage 384 is typically comprised of one or more disk drives or tape drives and is used for non-volatile storage of data and as an over-flow data storage device if RAM 386 is not large enough to hold all working data. Secondary storage 384 may be used to store programs which are loaded into RAM 386 when such programs are selected for execution. The ROM 388 is used to store instructions and perhaps data which are read during program execution. ROM 388 is a non-volatile memory device which typically has a small memory capacity relative to the larger memory capacity of secondary storage 384. The RAM 386 is used to store volatile data and perhaps to store instructions. Access to both ROM 388 and RAM 386 is typically faster than to secondary storage 384. The secondary storage 384, the RAM 386, and/or the ROM 388 may be referred to in some contexts as computer readable storage media and/or non-transitory computer readable media.

I/O devices 390 may include printers, video monitors, liquid crystal displays (LCDs), touch screen displays, keyboards, keypads, switches, dials, mice, track balls, voice recognizers, card readers, paper tape readers, or other well-known input devices.

The network connectivity devices 392 may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards that promote radio communications using protocols such as code division multiple access (CDMA), global system for mobile communications (GSM), long-term evolution (LTE), worldwide interoperability for microwave access (WiMAX), near field communications (NFC), radio frequency identity (RFID), and/or other air interface protocol radio transceiver cards, and other well-known network devices. These network connectivity devices 392 may enable the processor 382 to communicate with the Internet or one or more intranets. With such a network connection, it is contemplated that the processor 382 might receive information from the network, or might output information to the network in the course of performing the above-described method steps. Such information, which is often represented as a sequence of instructions to be executed using processor 382, may be received from and outputted to the network, for example, in the form of a computer data signal embodied in a carrier wave.

Such information, which may include data or instructions to be executed using processor 382 for example, may be received from and outputted to the network, for example, in the form of a computer data baseband signal or signal embodied in a carrier wave. The baseband signal or signal embedded in the carrier wave, or other types of signals currently used or hereafter developed, may be generated according to several methods well-known to one skilled in the art. The baseband signal and/or signal embedded in the carrier wave may be referred to in some contexts as a transitory signal.

The processor 382 executes instructions, codes, computer programs, scripts which it accesses from hard disks, floppy disks, optical disks (these various disk based systems may all be considered secondary storage 384), flash drives, ROM 388, RAM 386, or the network connectivity devices 392.

While only one processor 382 is shown, multiple processors may be present. Thus, while instructions may be discussed as executed by a processor, the instructions may be executed simultaneously, serially, or otherwise executed by one or multiple processors. Instructions, codes, computer programs, scripts, and/or data that may be accessed from the secondary storage 384, for example, hard drives, floppy disks, optical disks, and/or other devices, the ROM 388, and/or the RAM 386 may be referred to in some contexts as non-transitory instructions and/or non-transitory information.

In an embodiment, the computer system 380 may comprise two or more computers in communication with each other that collaborate to perform a task. For example, but not by way of limitation, an application may be partitioned in such a way as to permit concurrent and/or parallel processing of the instructions of the application. Alternatively, the data processed by the application may be partitioned in such a way as to permit concurrent and/or parallel processing of different portions of a data set by the two or more computers. In an embodiment, virtualization software may be employed by the computer system 380 to provide the functionality of a number of servers that is not directly bound to the number of computers in the computer system 380. For example, virtualization software may provide twenty virtual servers on four physical computers. In an embodiment, the functionality disclosed above may be provided by executing the application and/or applications in a cloud computing environment. Cloud computing may comprise providing computing services via a network connection using dynamically scalable computing resources. Cloud computing may be supported, at least in part, by virtualization software. A cloud computing environment may be established by an enterprise and/or may be hired on an as-needed basis from a third party provider. Some cloud computing environments may comprise cloud computing resources owned and operated by the enterprise as well as cloud computing resources hired and/or leased from a third party provider.

In an embodiment, some or all of the functionality disclosed above may be provided as a computer program product. The computer program product may comprise one or more computer readable storage medium having a computer usable program code embodied therein to implement the functionality disclosed above. The computer program product may comprise data structures, executable instructions, and other computer usable program codes. The computer program product may be embodied in removable computer storage media and/or non-removable computer storage media. The removable computer readable storage medium may comprise, without limitation, a paper tape, a magnetic tape, a magnetic disk, an optical disk, a solid state memory chip, for example analog magnetic tape, compact disk read only memory (CD-ROM) disks, floppy disks, jump drives, digital cards, multimedia cards, and others. The computer program product may be suitable for loading, by the computer system 380, at least portions of the contents of the computer program product to the secondary storage 384, to the ROM 388, to the RAM 386, and/or to other non-volatile memory and volatile memory of the computer system 380. The processor 382 may process the executable instructions and/or data structures in part by directly accessing the computer program product, for example by reading from a CD-ROM disk inserted into a disk drive peripheral of the computer system 380. Alternatively, the processor 382 may process the executable instructions and/or data structures by remotely accessing the computer program product, for example by downloading the executable instructions and/or data structures from a remote server through the network connectivity devices 392. The computer program product may comprise instructions that promote the loading and/or copying of data, data structures, files, and/or executable instructions to the secondary storage 384, to the ROM 388, to the RAM 386, and/or to other non-volatile memory and volatile memory of the computer system 380.

In some contexts, the secondary storage 384, the ROM 388, and the RAM 386 may be referred to as a non-transitory computer readable medium or a computer readable storage media. A dynamic RAM embodiment of the RAM 386, likewise, may be referred to as a non-transitory computer readable medium in that while the dynamic RAM receives electrical power and is operated in accordance with its design, for example during a period of time during which the computer system 380 is turned on and operational, the dynamic RAM stores information that is written to it. Similarly, the processor 382 may comprise an internal RAM, an internal ROM, a cache memory, and/or other internal non-transitory storage blocks, sections, or components that may be referred to in some contexts as non-transitory computer readable media or computer readable storage media.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system, or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. An explosion-proof electronic system comprising:
a substantially explosion-proof enclosure;
an electrical coil located within the substantially explosion-proof enclosure;
an electrical excitation circuit located within the substantially explosion-proof enclosure and connected to the electrical coil, where the electrical excitation circuit is configured to cause the electrical coil to establish a magnetic field that extends through the substantially explosion-proof enclosure; and
a processor located within the substantially explosion-proof enclosure and coupled to the electrical excitation circuit, where the processor is configured to:
monitor a power factor (PF) of the electrical excitation circuit,
identify a fluctuation of the PF that exceeds a predetermined threshold as a control input, and
transmit an output in response to identifying the control input, whereby a human operator can provide the control input by bringing a finger proximate to the substantially explosion-proof enclosure.

2. The system of claim 1, further comprising a substantially explosion-proof glass window forming a portion of the substantially explosion-proof enclosure, wherein the electrical coil is positioned within the substantially explosion-proof enclosure such that a longitudinal axis of the electrical coil is about perpendicular to the substantially explosion-proof glass window.

3. The system of claim 1, wherein the electrical excitation circuit is configured to provide an alternating current (AC) input to the electrical coil.

4. The system of claim 1, wherein the explosion-proof electronic system comprises a gas detector.

5. The system of claim 1, wherein the processor is a microprocessor.

6. The system of claim 1, wherein the processor is one of a microcontroller, an application-specific integrated circuit (ASIC), a digital signal processor (DSP), a field-programmable gate array (FPGA) or a complex programmable logic device (CPLD).

\* \* \* \* \*

UNITED STATES PATENT AND TRADEMARK OFFICE
CERTIFICATE OF CORRECTION

PATENT NO. : 9,966,948 B2  
APPLICATION NO. : 15/045770  
DATED : May 8, 2018  
INVENTOR(S) : JunSeong Park et al.

Page 1 of 1

It is certified that error appears in the above-identified patent and that said Letters Patent is hereby corrected as shown below:

On the Title Page

Item (74), Line 2: insert --,-- after "Martin"

Signed and Sealed this
Ninth Day of October, 2018

Andrei Iancu
*Director of the United States Patent and Trademark Office*